(12) United States Patent
Labetski et al.

(10) Patent No.: US 8,368,032 B2
(45) Date of Patent: Feb. 5, 2013

(54) RADIATION SOURCE, LITHOGRAPHIC APPARATUS, AND DEVICE MANUFACTURING METHOD

(75) Inventors: Dzmitry Labetski, Utrecht (NL); Erik Roelof Loopstra, Eindhoven (NL); Gerardus Hubertus Petrus Maria Swinkels, Eindhoven (NL); Tom Van Zutphen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 402 days.

(21) Appl. No.: 12/712,545

(22) Filed: Feb. 25, 2010

(65) Prior Publication Data
US 2010/0231130 A1     Sep. 16, 2010

Related U.S. Application Data

(60) Provisional application No. 61/159,368, filed on Mar. 11, 2009, provisional application No. 61/265,023, filed on Nov. 30, 2009.

(51) Int. Cl.
*H05H 1/42* (2006.01)
*H05H 1/00* (2006.01)
*H01J 61/28* (2006.01)
*H01J 37/08* (2006.01)

(52) U.S. Cl. ............... 250/423 R; 250/424; 250/493.1; 313/231.31; 315/111.21; 315/111.41; 378/34

(58) Field of Classification Search ............... 250/493.1, 250/423 R, 424; 313/231.31; 315/111.21, 315/111.41; 378/34
See application file for complete search history.

(56) References Cited

U.S. PATENT DOCUMENTS

| | | | | |
|---|---|---|---|---|
| 5,196,706 A | * | 3/1993 | Keller et al. | ............... 250/396 R |
| 5,262,611 A | * | 11/1993 | Danysh et al. | ........... 219/121.43 |
| 6,377,651 B1 | * | 4/2002 | Richardson et al. | ............ 378/34 |
| 7,687,788 B2 | * | 3/2010 | Van Herpen et al. | ..... 250/504 R |
| 7,872,245 B2 | * | 1/2011 | Vaschenko et al. | ........ 250/492.2 |
| 8,115,900 B2 | * | 2/2012 | Van De Vijver et al. | ........ 355/30 |
| 2008/0283779 A1 | | 11/2008 | Tran et al. | |

* cited by examiner

*Primary Examiner* — Nikita Wells
(74) *Attorney, Agent, or Firm* — Pillsbury Winthrop Shaw Pittman LLP

(57) ABSTRACT

A plasma radiation source includes a vessel configured to catch a source material transmitted along a trajectory, and a decelerator configured to reduce a speed of the source material in a section of the trajectory downstream of a plasma initiation site.

20 Claims, 5 Drawing Sheets

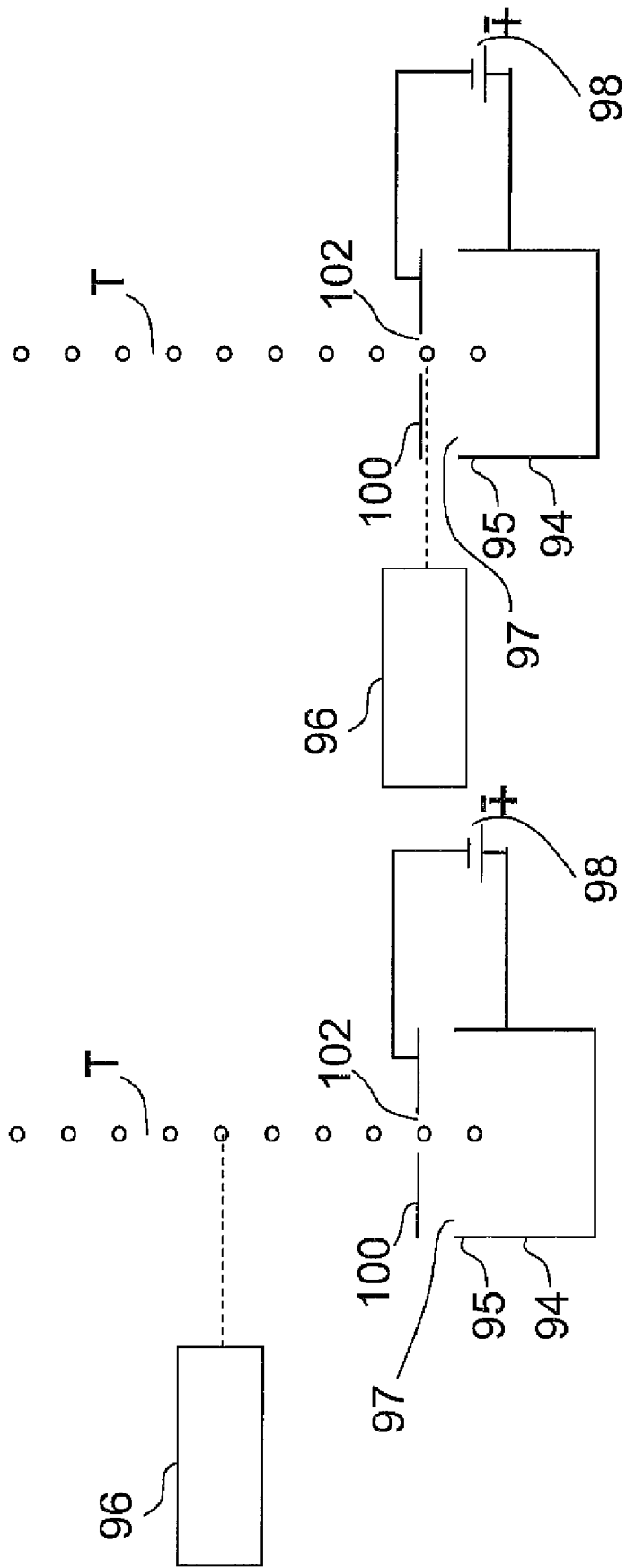

RADIATION SOURCE, LITHOGRAPHIC APPARATUS, AND DEVICE MANUFACTURING METHOD

CROSS-REFERENCE TO RELATED APPLICATIONS

This application claims the benefit of priority from U.S. Provisional Patent Application Ser. No. 61/159,368, filed Mar. 11, 2009, and U.S. Provisional Patent Application Ser. No. 61/265,023, filed Nov. 30, 2009, the entire contents of both of which are incorporated herein by reference.

FIELD

The present invention relates to a radiation source, a lithographic apparatus and a device manufacturing method.

BACKGROUND

A lithographic apparatus is a Machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \qquad (1)$$

where $\lambda$ is the wavelength of the radiation used, NA is the numerical aperture of the projection system used to print the pattern, k1 is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapour, such as Xe gas or Li vapour. A laser device, such as a $CO_2$ laser, may provide the strong laser beam. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Debris may be released from the plasma during or after plasma irradiation. Such debris may damage the radiation source. For example, such debris can damage surfaces of optics.

U.S. Pat. No. 6,377,651 B discloses a laser produced extreme ultraviolet (EUV) source based on a water droplet target with an auxiliary electrode system between the source and the collector mirror. The collector mirror collects the EUV radiation produced by the plasma. The auxiliary electrode system creates a repellent electric field, by imposing a DC voltage on the mirror that slows down and reverses the trajectories of ions from the plasma source before they impact the collector mirror.

United States Patent Application Publication No. 2008/0283779 discloses a plasma radiation system with collector mirror that is formed for normal incidence of radiation arranged behind the plasma. An additional mechanical fin arrangement for suppressing debris is arranged between a gas curtain generated and the collector mirror. The gas curtain may comprise a buffer gas for decelerating debris particles, or a gas mixture, which brings about a spectral filtering of the emitted EUV radiation at the same time.

SUMMARY

According to an aspect of the invention, there is provided a plasma radiation source comprising a vessel configured to catch a source material transmitted along a trajectory, and a decelerator configured to reduce a speed of said source material in a section of said trajectory downstream of a plasma initiation site.

According to an aspect of the invention, there is provided a lithographic apparatus comprising a plasma radiation source configured to generate radiation. The plasma radiation source comprises a vessel configured to catch a source material transmitted along a trajectory and a decelerator configured to reduce a speed of said source material in a section of said trajectory downstream of a plasma initiation site. The lithographic apparatus also includes a support constructed and arranged to support a patterning device, the patterning device being configured to impart radiation generated by the plasma radiation source to form a patterned radiation beam; and a projection system constructed and arranged to project the patterned radiation beam onto a substrate According to an aspect of the invention, there is provided a method of catching a source material of a plasma radiation source comprising the steps of transmitting said source material from a plasma initiation site along a trajectory, reducing a speed of said source material in a section of said trajectory downstream of said plasma initiation site, and catching said source material.

According to an aspect of the invention, there is provided a method of supplying radiation for a lithographic apparatus. The method includes transmitting source material from a plasma initiation site along a trajectory; reducing a speed of said source material in a section of said trajectory downstream of said plasma initiation site; and catching said source material. The method further comprises one or more of electrically charging said source material; delivering said source material along the trajectory via said plasma initiation site; supplying radiation to said source material at said plasma initiation site so as to initiate a plasma; and focusing radiation emitted from said plasma initiation site to a focal point. Reducing the speed may include decelerating the source material in a direction away from the plasma initiation site.

According to an aspect of the invention, there is provided a device manufacturing method that includes supplying radiation emitted from source material at a plasma initiation site to a patterning device; and transferring a pattern onto a substrate. Supplying the radiation includes transmitting said source material from said plasma initiation site along a trajectory; reducing a speed of said source material in a section of said trajectory downstream of said plasma initiation site; and catching said source material.

According to an aspect of the invention, there is provided an extreme ultraviolet radiation source. The source includes a source material target delivery system constructed and arranged to deliver a source material along a predetermined trajectory to a plasma initiation site, a laser system constructed and arranged to direct a laser beam to the source material at the plasma initiation site in order to create an extreme ultraviolet radiation-emitting plasma, a voltage supply constructed and arranged to generate an electric field downstream relative to the initiation site along at least a part of the trajectory, a charger constructed and arranged to electrically charge at least part of the source material at a location upstream relative to at least part of the electric field, and a catch constructed and arranged to catch the source material delivered by the source material target delivery system. The charger may be an electron gun or an ion gun. The source material may be a liquid metal, such as tin, lithium, gadolinium, and/or terbium. Additionally or alternatively, the source material may be a gadolinium compound and/or a terbium compound. The charger may be arranged to charge at least said part of the source material at a location in the electric field. Preferably, the catch is located downstream relative to the initiation site. At least part of the electric field may be located within the catch. The radiation source typically may include a collector mirror constructed and arranged to focus radiation emitted by the plasma to a focal point. The voltage supply may be configured to provide at least part of the catch with a potential configured to attract the source material.

According to an aspect of the invention, there is provided an extreme ultraviolet radiation source. Such a radiation source may for instance be comprised in a lithographic apparatus. The source comprises a source material target delivery system constructed and arranged to deliver a source material along a predetermined trajectory to a plasma initiation site, a laser system constructed and arranged to direct a laser beam to the source material at the plasma initiation site in order to create an extreme ultraviolet radiation-emitting plasma, a catch constructed and arranged to catch the source material delivered by the source material target delivery system, wherein the catch comprises a container constructed and arranged to collect the source material, the container being provided with one or more inlets, the one or more inlets being constructed and arranged to provide a gas flow partly inside the catch in a direction substantially upstream the trajectory and a flow partly inside the catch in a direction substantially downstream the trajectory. The gas flow may be a hydrogen gas flow, an argon gas flow, and a helium gas flow or a combination thereof. The one or more inlets may be a plurality of inlets, wherein each of the inlets are configured to provide a flow, the flows interacting with one or more other said flows in order to form the gas flow in the direction substantially upstream the trajectory and the flow in the direction substantially downstream the trajectory. The catch may be provided with an outlet arranged to evacuate the gas flow in the direction substantially downstream the trajectory.

According to an aspect of the invention, there is provided a lithographic projection apparatus that includes an extreme ultraviolet radiation source constructed and arranged to generate extreme ultraviolet radiation. The source includes a source material target delivery system constructed and arranged to deliver a source material along a predetermined trajectory to a plasma initiation site, a laser system constructed and arranged to direct a laser beam to the source material at the plasma initiation site in order to create an extreme ultraviolet radiation-emitting plasma, a voltage supply constructed and arranged to generate an electric field downstream relative to the initiation site along at least a part of the trajectory, a charger constructed and arranged to electrically charge at least part of the source material at a location upstream relative to at least part of the electric field, and a catch constructed and arranged to catch the source material delivered by the source material target delivery system. The lithographic projection apparatus also includes a support constructed and arranged to support a patterning device, the patterning device being configured to impart the extreme ultraviolet radiation with a pattern to form a patterned radiation beam. A projection system is constructed and arranged to project the patterned radiation beam onto a substrate.

According to a further aspect of the present invention, there is provided a lithographic projection apparatus that includes an extreme ultraviolet radiation source constructed and arranged to generate extreme ultraviolet radiation. The extreme ultraviolet radiation source includes a source material target delivery system constructed and arranged to deliver a source material along a predetermined trajectory to a plasma initiation site, a laser system constructed and arranged to direct a laser beam to the source material at the plasma initiation site in order to create an extreme ultraviolet radiation-emitting plasma, a catching device constructed and arranged to catch the source material delivered by the source material target delivery system, wherein the catch comprises a container constructed and arranged to collect the source material, the container being provided with one or more inlets, the one or more inlets being constructed and arranged to provide a gas flow partly inside the catch in a direction substantially upstream the trajectory and a flow partly inside the catch in a direction substantially downstream the trajectory. The lithographic projection apparatus also includes a support constructed and arranged to support a patterning device, the patterning device being configured to impart the extreme ultraviolet radiation with a pattern to form a patterned radiation beam. A projection system is constructed and arranged to project the patterned radiation beam onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 4 depicts a catching device of the radiation source of FIG. 3;

FIG. 5 depicts a modification of the catching device of FIG. 4; and

DETAILED DESCRIPTION

Figure 1:
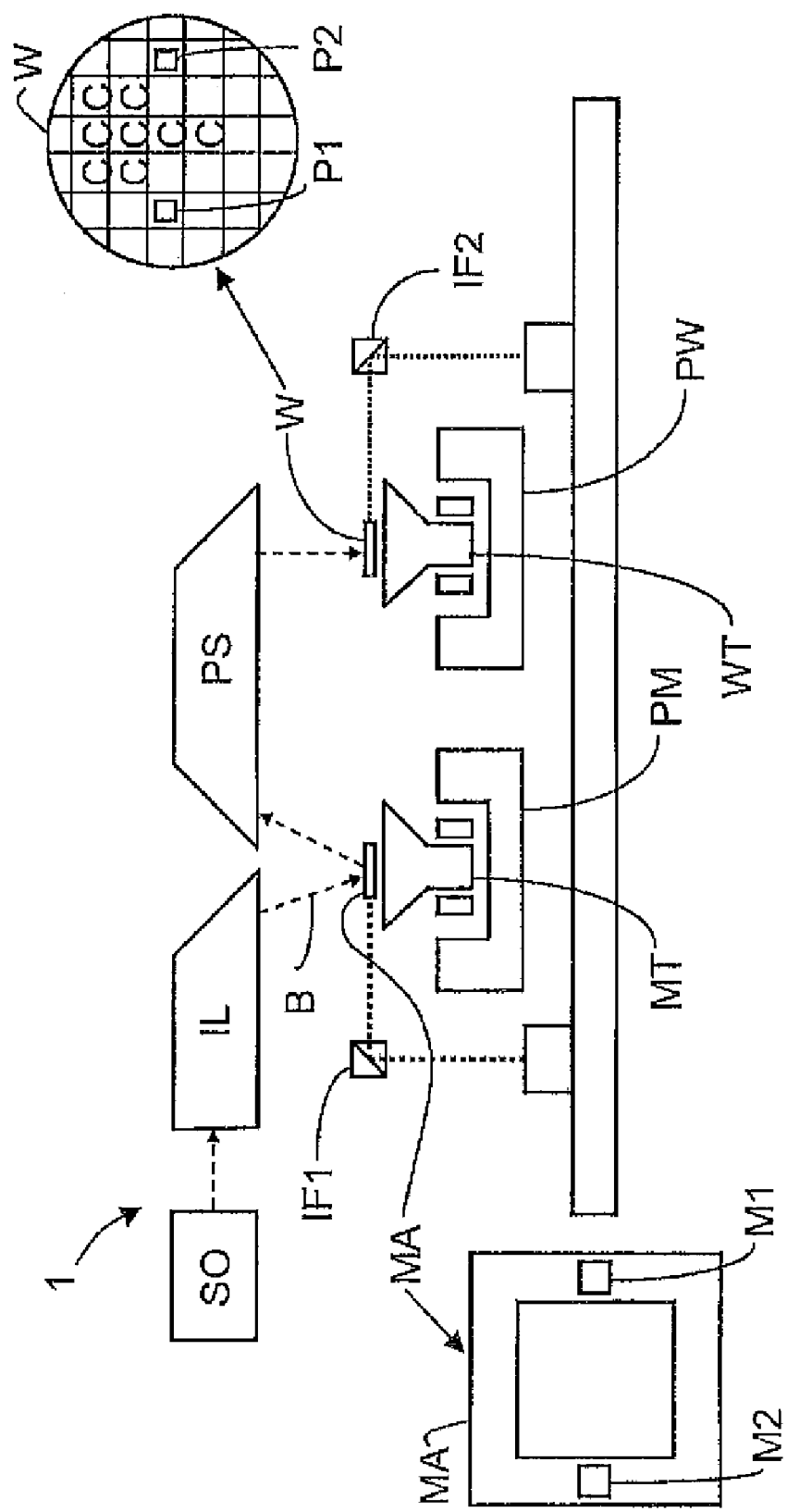
FIG. 1 depicts a lithographic apparatus according to an embodiment of the invention.

FIG. 1 schematically depicts a lithographic apparatus 1 including a source collector module SO according to an embodiment of the invention. The apparatus comprises an illumination system (illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser-produced plasma ("LPP") the plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:
1) In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.
2) In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.
3) In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Figure 2:
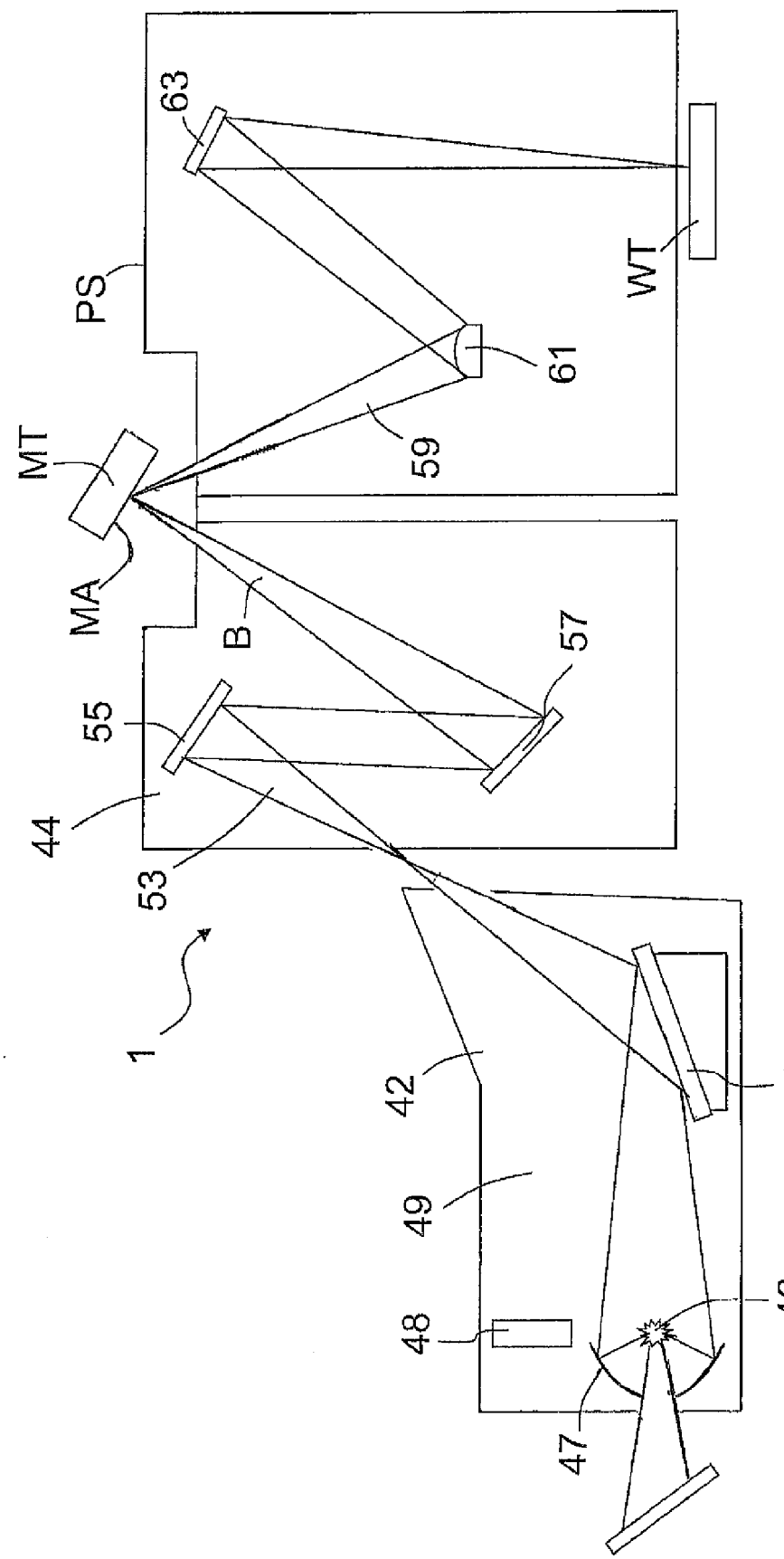
FIG. 2 is a more detailed view of the apparatus of FIG. 1.

FIG. 2 shows the lithographic projection apparatus 1 in more detail, including a radiation system 42, an illumination system 44, and the projection system PS. The radiation system 42 includes a source chamber 49. The radiation emitted by a radiation source reflects on a collector mirror 47 configured to focus radiation emitted by the plasma 46 onto a focal point which, in this embodiment coincides with a so-called intermediate focus, In this embodiment, the radiation is focused onto the focal point via a grazing incidence mirror 51. The source chamber 49 may further comprise a contaminant barrier (not shown in the Figures). The contaminant barrier may comprise a gas barrier or a combination of a gas barrier and a channel structure.

From source chamber 49, a beam of radiation 53 is reflected in the illumination system 44 via normal incidence reflectors 55, 57 onto a patterning device MA (e.g., a reticle or mask) positioned on patterning device support MT (e.g., a reticle or mask table). A patterned beam 59 is formed which is imaged in projection system PS via reflective elements 61, 63 onto substrate table WT. More elements than shown may generally be present in illumination system 44 and projection system PS. The grazing incidence mirror 51 may optionally be present, depending upon the type of lithographic apparatus. The grazing incidence mirror 51 may be a grating spectral filter. Further, there may be more mirrors present than those shown in the Figures, for example there may be one, two, three, four or even more reflective elements present than elements 61, 63.

Instead of or in addition to a grating spectral filter, as schematically depicted in FIG. 2, a transmissive optical filter may be applied that is transmissive for EUV and less transmissive for or even substantially absorbing of UV radiation. Hence, "grating spectral purity filter" is herein further indicated as "spectral purity filter" which includes gratings or transmissive filters. Not depicted in schematic FIG. 2, but also included as an optional optical element may be an optical EUV transmissive filter in illumination system 44 and/or projection system PS.

All optical elements shown in FIG. 2 (and optical elements not shown in the schematic drawing of this embodiment) are vulnerable to deposition of contaminants (for instance produced by source SO), for example, Sn. This is the case for the radiation collector 47 and, if present, the spectral purity filter.

Figure 3:
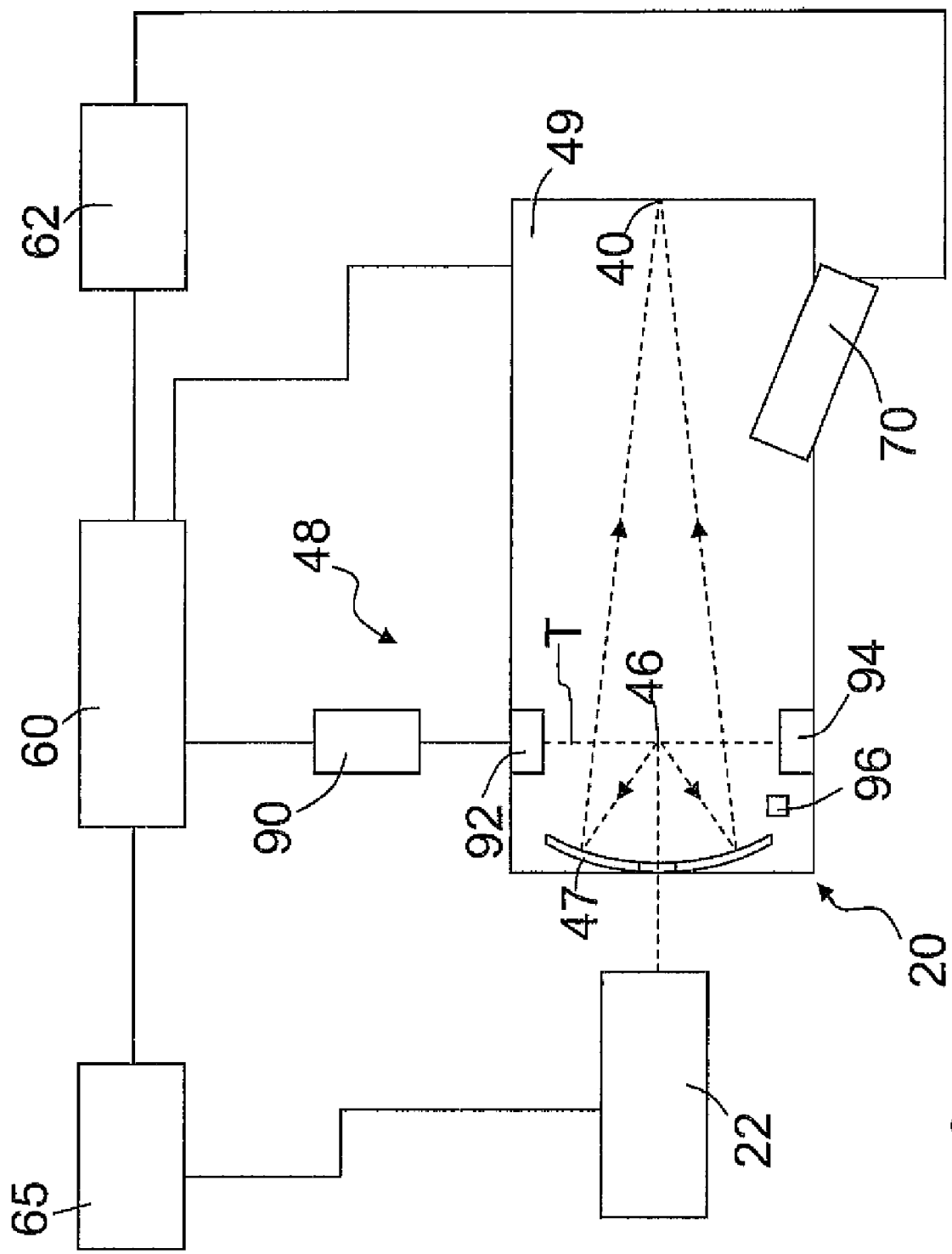
FIG. 3 depicts a radiation source of the lithographic apparatus of FIG. 2.

With reference to FIG. 3, there is shown a schematic view of an EUV radiation source, e.g., a laser-produced-plasma, EUV radiation source 20 according to an embodiment of the invention. As shown in FIG. 3, and described in further details below, the LPP radiation source 20 may include a laser system 22 for generating a train of light pulses and delivering the light pulses into the chamber 49. As detailed below, each light pulse may travel along a beam path from the laser system 22 and into the chamber 49 to illuminate a respective target droplet at a plasma initiation site 46.

Suitable lasers for use in the system 22 shown in FIG. 3 may include a pulsed laser device, e.g., a pulsed gas discharge $CO_2$ laser device producing radiation at 9.3 μm or 10.61 μm, e.g., with DC or RF excitation, operating at relatively high power, e.g., 10 kW or higher and high pulse repetition rate, e.g., 50 kHz or more. In an embodiment, the laser may be an axial-flow RF-pumped $CO_2$ having a master oscillator power amplifier (MOPA) configuration with multiple stages of amplification and having a seed pulse that is initiated by a Q-switched Master Oscillator (MO) with low energy and high repetition rate, e.g., capable of 100 kHz operation. From the MO, the laser pulse may then be amplified, shaped, and focused before entering the LPP chamber. Continuously pumped $CO_2$ amplifiers may be used for the laser system 22. In an embodiment, the laser may be configured as a so-called "self-targeting" laser system in which the droplet serves as one mirror of the optical cavity. In some "self-targeting" arrangements, a master oscillator may not be used.

Depending on the application, other types of lasers may also be suitable, e.g., an excimer or molecular fluorine laser operating at high power and high pulse repetition rate. Examples include, a solid state laser, e.g., having a fibre or disk shaped active media, a MOPA configured excimer laser system, e.g., an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

As further shown in FIG. 3, the EUV radiation source 20 may also include a source material target delivery system 48, e.g., delivering droplets of a source material into the interior of a chamber 49 to the plasma initiation site 46 where the droplets will interact with one or more light pulses, e.g., one or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets. For example, the element tin may be used as pure tin, as a tin compound, e.g., $SnBr_4$, $SnBr_2$, $snH_4$, as a tin alloy, e.g., tin-gallium alloys, tin-indium alloys, tin-indium-gallium alloys, or a combination thereof. Alternatively, lithium, gadolinium, and/or terbium may be used as a source material either in pure form or as a compound, an alloy or a mixture thereof, desirably as a liquid metal. Depending on the material used, the target material may be presented to the irradiation region 46 at various temperatures including room temperature or near room temperature (e.g., tin alloys, $SnBr_4$) at an elevated temperature, (e.g., pure tin) or at temperatures below room temperature, (e.g., $SnH_4$), and in some cases, can be relatively volatile, e.g., $SnBr_4$.

Continuing with FIG. 3, the EUV radiation source 20 may also include an optic 47, e.g., a collector mirror in the form of a truncated ellipsoid having, e.g., a graded multi-layer coating with alternating layers of Molybdenum and Silicon. FIG. 3 shows that the optic 47 may be formed with an aperture to allow the light pulses generated by the system 22 to pass through and reach the plasma initiation site 46. As shown, the optic 47 may be, e.g., an ellipsoidal mirror that has a first focus within or near the plasma initiation site 46 and a second focus at a so-called intermediate region 40 where the EUV radiation may be output from the EUV radiation source 20 and input to a device utilizing EUV light, e.g., an integrated circuit lithography tool, such as the apparatus 1 illustrated in FIG. 1. It is to be appreciated that other optics may be used in place of the ellipsoidal mirror for collecting and directing light to an intermediate location for subsequent delivery to a device utilizing EUV light, for example the optic may be parabolic or may be configured to deliver a beam having a ring-shaped cross-section to an intermediate location.

The EUV radiation source 20 may also include an EUV controller 60, which may also include a firing control system 65 for triggering one or more lamps and/or laser devices in the laser system 22 to thereby generate light pulses for delivery into the chamber 49. The EUV radiation source 20 may also include a droplet position detection system, which may include one or more droplet imagers 70 that provide an output indicative of the position of one or more droplets, e.g., relative to the plasma initiation site 46. The imager(s) 70 may provide this output to a droplet position detection feedback system 62, which can, e.g., compute a droplet position and trajectory T, from which a droplet error can be computed, e.g., on a droplet by droplet basis or on average. The droplet error may then be provided as an input to the controller 60, which can, for example, provide a position, direction and/or timing correction signal to the laser system 22 to control a source timing circuit and/or to control a beam position and shaping system, e.g., to change the location and/or focal power of the light pulses being delivered to the plasma initiation site 46 in the chamber 49.

The EUV radiation source 20 may include one or more EUV metrology instruments for measuring various properties of the EUV radiation generated by the source 20. These properties may include, for example, intensity (e.g., total intensity or intensity within a particular spectral band), spectral bandwidth, polarization, beam position, pointing, etc. For the EUV radiation source 20, the instrument(s) may be configured to operate while the downstream tool, e.g., photolithography scanner, is on-line, e.g., by sampling a portion of the BUY output, e.g., using a pickoff mirror or sampling "uncollected" EUV radiation, and/or may operate while the downstream tool, e.g., photolithography scanner, is off-line, for example, by measuring the entire EUV output of the EUV radiation source 20.

As further shown in FIG. 3, the EUV radiation source 20 may include a droplet control system 90, operable in response to a signal (which in some implementations may include the droplet error described above, or some quantity derived therefrom) from the controller 60, to e.g., modify the release point of the target material from a droplet source 92 and/or modify droplet formation timing, to correct for errors in the droplets arriving at the desired plasma initiation site 46 and/or synchronize the generation of droplets with a pulsed laser system 22.

As mentioned above, debris may be released from the plasma during or after plasma irradiation. Such debris may damage the radiation source. For example, such debris can damage surfaces of optics. In order to prevent the debris from damaging the source, a device for catching particles of source material after plasma irradiation has been proposed. Unfortunately, splashing inside the catching device can still result in a large number of secondary particles escaping from the droplet-catching device. After interaction with walls of the catching device or after interaction with source material contained within the catching device, small fragments of the particles can re-enter the source chamber of the radiation source. Such fragments may be the source material itself, or its derivatives. For example, if the source material is tin, compounds such as $SnH_4$ can escape the catching device. The cloud of particles can contaminate the source vacuum chamber.

Turning to FIGS. 4 and 5, the plasma radiation source 20 comprises a vessel 95 configured to catch source material transmitted along a trajectory. The vessel 95 is a part of a catching device, or catch 94. The catch 94 is positioned at a location downstream relative to a plasma initiation site 46. The catch 94 is constructed and arranged to catch the source material delivered by the source material target delivery system. The vessel, or container 95 has an opening 97.

The droplets do not necessarily travel vertically, but can also travel horizontally, for example. The droplets may have a starting velocity. The droplets are ejected from a source material target system: in a large container the source material (e.g. tin) is heated and put under a large pressure e.g. $8-20 \times 10^4$ Pa. The container may also contain a small orifice equipped with a piezo electric transducer (PZT). A small jet "escapes" through this orifice and is modulated by the PZT. The jet thus is modulated in shape and due to surface tension breaks up into small droplets. By adjusting, for example, the pressure inside the reservoir the droplet speed can be manipulated. As an alternative to the piezo electric transducer, a magnetostrictor or an electrostrictor may be used.

The radiation source 20 also comprises a decelerator configured to reduce a speed of the source material in a section of the trajectory downstream of the plasma initiation site 46. The decelerator reduces the speed of the source material toward the vessel 95. The function of the decelerator is that the particles or droplets of source material land in the vessel 95 either at a lower absolute speed or at a different angle of impact than would be the case without the decelerator.

According to the present invention, source material is transmitted from a plasma initiation site 46 along a predetermined trajectory T. The speed of the source material toward the vessel 95 is reduced in a section of the predetermined trajectory T downstream of the plasma initiation site 46. The source material is then caught.

Accordingly, the amount of debris produced by the source material impacting the container 95 or material deposited within the container 95 is reduced. This is because if the speed toward the vessel is reduced, the impact of the source material with the container 95 produces less derivative debris. Hence, less of the debris will escape the container 95 to cause potential damage. In turn, this reduces the contamination of the source vacuum chamber and the damage caused to optics.

In an embodiment, the radiation source 20 further comprises a trap configured to retain the source material in the vessel 95. The caught source material is retained in the vessel 95 in which the source material is caught.

Where debris is produced, the trap reduces the amount of debris that escapes the vessel 95. Accordingly, any damage or contamination caused by escaping debris is reduced.

In an embodiment, the decelerator comprises an electric field generator configured to generate an electric field downstream of the plasma initiation site. Moreover, the trap may comprise a portion of a surface of the vessel being electrically charged so as to attract the source material being oppositely electrically charged.

The electric field generator may comprise a plate and a voltage supply. The plate 100 has a conductive surface and a hole 102 through which the source material may travel. The voltage supply 98 is configured to apply a potential difference between the plate and the catching device.

A plate is only an example of a suitable electrode for decelerating the particles of source material. Other types of electrode may be suitable. The plate 100 may have the advantage of being a relatively simple design.

In the embodiments depicted in FIGS. 4 and 5, the voltage supply 98 is arranged to provide the plate 100 having an opening 102 with a negative potential relative to the potential of the catching device 94. Thus, an electric field downstream relative to the initiation site 46 is generated along at least a part of the trajectory T. Moreover, the electric field is partially located within the catching device 94.

The plate 100 is configured to repel and slow down the particles of source material, which are negatively charged. As a result of the interaction between the plate and the particles, the particles have less kinetic energy when entering the catching device 94. The catching device 94 is configured to attract the negatively charged particles of the source material. Of course, it will be readily appreciated that the plate may alternatively be given a positive potential and the catching device 94 a negative potential in the case that the particles of source material are positively charged. The polarity of the potential of the plate 100 and catching device 94 are chosen in accordance with the charge of the particles of source material.

As shown in FIGS. 4 and 5, the radiation source may comprise a charging device 96, which may also be referred to as a charger and in an embodiment may be an electron gun. The charger 96 is constructed and arranged to electrically charge at least part of the source material at a location upstream relative to at least part of the electric field.

In FIG. 4, the electron gun is arranged to charge at least said part of the source material at a location upstream relative to the electric field. In FIG. 5, the electron gun is arranged to charge at least said part of the source material at a location within the electric field. Although an electron gun is mentioned while referring to FIGS. 4 and 5, a person skilled in the art will acknowledge that, for instance, ion guns may also be suitable to be applied as a charging device 96.

The voltage supply 98 is configured to provide the catching device 94 with a potential configured to attract the source material. This, of course relates closely to the whether the source material is positively charged or negatively charged as will be readily acknowledged by the skilled person.

The voltage applied to the electrode (e.g. plate 100) and the catching device 94 may be static (i.e. DC) such that all droplets of the source material undergo the same electromagnetic forces. Alternatively, the voltage applied may be dynamic such that the velocity change applied to each droplet of source material may be tailored to that droplet. In this case, the voltage applied is variable. The radiation source may comprise a detector 70 configured to detect the particles and a property thereof (e.g. velocity, position, timing etc.) and a controller 60 configured to adjust the output of the charger 96 in accordance with the output of the detector 70.

If the source chamber contains a gas such that the source material travels through a gas atmosphere, it may be desirable to use gases that have a low electronegativity value or a low tendency to attract electrons. Desirably, the pressure within the source chamber is within the range of 50-200 Pa, more desirably 70-110 Pa, and more desirably about 100 Pa.

In an embodiment, the droplet generator, electrode 100 and catching device 94 are encapsulated and pumped to create a desired vacuum pressure. One potential advantage of using vacuum pressure is that it may reduce the risk of electrical discharges due to the Paschen effect.

In an embodiment, the electron gun and the catching device 94 are encapsulated in a sealed vessel that is pumped to a desired pressure. In this embodiment, it is possible to use inside the vessel a gas with high electronegativity and charge the particles of source material inside the catching device (for example as illustrated in FIG. 5).

By applying the electric field as described above, splashing of any source material entering the catching device 94 will be significantly reduced due to the reduction in speed of the source material caused by the electromagnetic repulsion between the source material and the plate 100.

The charger may supply charge such that the source material droplets acquire a potential of for example about 5 kV. The capacitance of each droplet is a function of the droplet radius according to the following equation (2):

$$C = \frac{Q}{V} = 4\pi\varepsilon_0 r \tag{2}$$

and the droplet will acquire a charge as described above of Q=CV. The source material droplets may have a diameter in the region of about 20-30 μm. Larger or smaller droplets may also be used. With these values, a droplet can be stopped and rejected by repulsion from the plate 100 if the plate is charged to a potential of about 10 kV.

In an embodiment, there is a second charger for charging the source material. In such an embodiment, there is provided a control system configured to control the chargers such that each droplet may have a particular charge. Accordingly, each droplet may be decelerated and attracted to the catching device 94 by a different amount.

In an embodiment, a magnetic field, additionally or alternatively is used for trapping and/or manipulation of the charged particles. In particular, the trap may comprise a magnetic field generator configured to generate a magnetic field within the vessel. The decelerator may comprise a magnetic field generator configured to generate a magnetic field downstream of the plasma initiation site.

For the trap and/or the decelerator, a B-field may be applied in a direction that includes a component that is perpendicular to the direction of movement of the droplets. When a charged particle moves into this magnetic field, the particle is urged to follow a circular path. The magnetic force, which is perpendicular to the velocity of the particle, provides a centripetal force.

The resulting circular component of the particle's trajectory changes the location and angle of impact of the droplet in the vessel. In particular, the angle of impact may be shallower than otherwise. The magnitude of the velocity vector of the particle is not affected by the B-field. This is because the force created by interaction between the particle and the magnetic field acts in a direction perpendicular to the motion of the particle. Hence, the B-field does no work and does not affect the energy of the particle. However, the magnetic field does result in reducing the speed of the particle toward the vessel. This involves redirecting the particle to decrease the velocity component towards the vessel and correspondingly increase a perpendicular component of the velocity of the particle. In other words, the magnetic field is arranged to reduce the speed of the source material toward the vessel 95. This reduces the possibility of derivative debris droplets splashing away from the vessel with sufficient velocity to escape the vessel.

Additionally, charged droplets that splash away from the location of impact in the vessel 95 will be influenced as well. Hence, the magnetic field is also effective as a trap.

In an embodiment, the B-field may be perpendicular to the initial trajectory of the particles. In an embodiment, the magnetic field generator comprises an electromagnet. In an embodiment, the magnetic field generator may comprise a permanent magnet.

Figure 6:
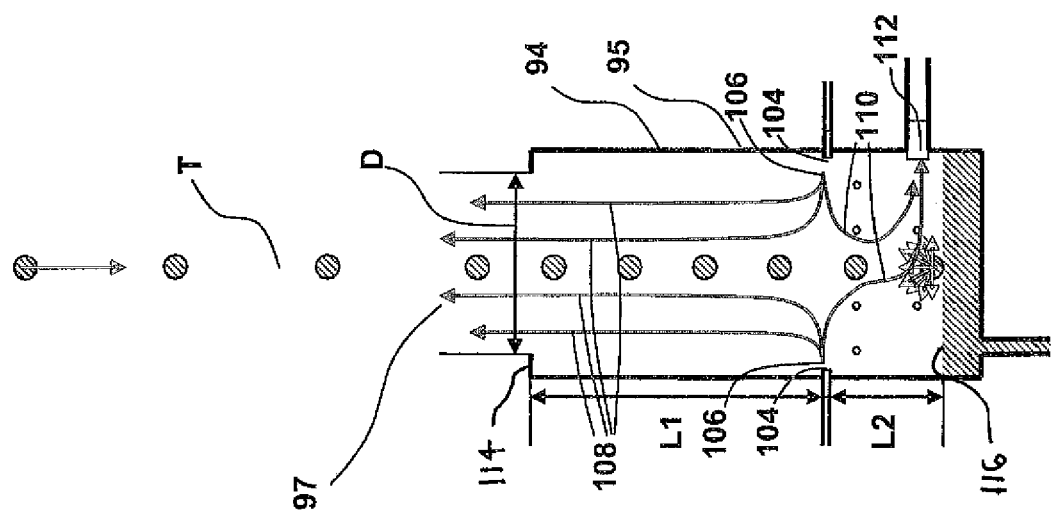
FIG. 6 depicts an embodiment of a catching device of the radiation source of FIG. 3.

An embodiment of the invention is depicted in FIG. 6. This embodiment of the EUV source is similar to the embodiments disclosed referring to FIGS. 3, 4 and 5. However, the charging device 94 and the voltage supply 98 of the embodiment depicted in FIGS. 3 to 5 are omitted. In this embodiment, the trap comprises a gas flow source configured to supply a gas flow in a direction substantially parallel to the trajectory of the source material and towards the vessel 95. This may prevent source material that has landed in the vessel 95 from escaping from the vessel 95.

Additionally or alternatively, the decelerator comprises a gas flow source configured to supply a gas flow in a direction substantially parallel to the trajectory of the source material.

In an embodiment, the catching device container 95 may be provided with one or more inlets 104. The inlets 104 each provide a flow of gas and these flows 106 interact with each other so as to form a gas flow 108 in a direction substantially upstream the trajectory T and/or a gas flow 110 in a direction substantially downstream the trajectory T. The gas flows 106, 108, 110 may comprise gasses such as hydrogen, helium and/or argon.

In an embodiment, the catching device is provided with an outlet 112 arranged to evacuate the gas flow 110 in the direction substantially downstream the trajectory T. The outlet 112 can be in fluid connection with a pump, for instance a vacuum pump (not shown in the Figures). In order to maintain a more homogeneous flow 110, it may be advantageous to provide a plurality of such outlets located at suitable locations with respect to the catching device container 95 and the other outlets.

As can be seen in FIG. 6, the gas flow 110 in the direction substantially downstream the trajectory T conveniently suppresses splashing that may occur due to the incoming source material. In this way, any splashing of the source material back into the source chamber 49 may be prevented or at least limited. Specifically, the gas flow away from the vessel 95 may reduce the impact speed of the particles of source material in the vessel 95, and the gas flow towards the vessel may act to prevent splash particles from exiting the vessel 95.

As shown in FIG. 6, a plurality of inlets may be provided at a distance L1 with respect to a top edge 114 of the container 95 and at a distance L2 with respect to an impact surface 116 of the container 95. Desirably, L1 is within the range of 300-700 mm, more desirably within the range of 400-600 mm, more desirably within the range of 450-550 mm and more desirably about 500 mm. Desirably, L2 is smaller than L1. This is to reduce the amount of time for which the droplet will undergo acceleration towards the bottom of the vessel 95 due to the downward gas flow. Desirably, L2 is within the range of 100-300 mm, more desirably within the range of 150-250 mm and more desirably about 200 mm.

Desirably, the flow rate of the gas flow toward the bottom of the vessel 95 should not as high as that of the gas flow away from the vessel. The purpose of this is that it is desirable to minimize the acceleration of droplets that have not yet reached the bottom of the vessel 95 toward the bottom. Desirably, the flow rate of the gas flow away from the bottom of the vessel is within the range of $1 \times 10^{-4}$–$2 \times 10^{-4}$ $m^3 s^{-1}$ at room temperature.

The top opening 97 of the container 95 has a diameter D. The diameter D is desirably within the range of 10-20 mm, more desirably within the range of 15-20 mm, and more desirably about 16 mm.

Desirably, the incoming source material comprises droplets having a diameter of about 20-30 µm. However, larger or smaller droplets may also be used. The droplets may have a velocity of about 30-50 $ms^{-1}$ immediately before reaching the bottom of the vessel 95. Higher or lower velocities are also possible.

The uses of gas flow, an electric field and a magnetic field for trapping and/or urging the droplets may be combined in an embodiment of the invention. For example, one or more of the techniques may be used to trap the droplets and another one or more of the techniques may be used to urge the droplets in the same embodiment.

The various embodiments of the apparatus and method for catching source material according to the present invention may be part of an apparatus and method for supplying radiation, e.g. EUV radiation. Such a radiation source may be part of a lithographic apparatus. Embodiments of the invention may be applied to a method of manufacturing a device involving supplying radiation, where the supplying involves catching plasma radiation source material using the apparatus and/or method of the present invention.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A plasma radiation source comprising:
    a source material delivery system configured to deliver droplets of a source material along a trajectory through a plasma initiation site;
    a vessel configured to catch the source material transmitted along the trajectory; and
    a decelerator configured to reduce a speed of said source material in a section of said trajectory downstream of the plasma initiation site.

2. The radiation source of claim 1, further comprising a trap configured to retain said source material in the vessel.

3. The radiation source of claim 2, wherein the trap comprises a portion of a surface of the vessel configured to be electrically charged so as to attract said source material being oppositely electrically charged.

4. The radiation source of claim 2, wherein the trap comprises a gas flow source configured to supply a gas flow in a direction substantially parallel to the trajectory of said source material and towards the vessel.

5. The radiation source of claim 2, wherein the trap comprises a magnetic field generator configured to generate a magnetic field for changing a direction of said source material within the vessel.

6. The radiation source of claim 1, wherein the decelerator comprises an electric field generator configured to generate an electric field downstream of said plasma initiation site.

7. The radiation source of claim 6, wherein the electric field generator comprises:
    a plate having a conductive surface and a hole through which said source material may travel; and
    a voltage supply configured to apply a potential difference between the plate and the vessel.

8. The radiation source of claim 1, wherein the decelerator comprises a gas flow source configured to supply a gas flow in a direction substantially parallel to the trajectory of said source material.

9. The radiation source of claim 1, wherein the decelerator comprises a magnetic field generator configured to generate a magnetic field for changing a direction of said source material downstream of said plasma initiation site.

10. The radiation source of claim 1, further comprising one or more of:
    a charger configured to electrically charge said source material;
    a plasma initiator configured to supply radiation to said source material at said plasma initiation site so as to initiate a plasma; and
    a collector mirror configured to focus radiation emitted from said plasma initiation site to a focal point.

11. The radiation source of claim 1, wherein the decelerator decelerates said source material in a direction from said plasma initiation site to the vessel.

12. A lithographic apparatus comprising:
    a plasma radiation source configured to generate radiation, the source comprising
        a source material delivery system configured to deliver droplets of a source material along a trajectory through a plasma initiation site
        a vessel configured to catch the source material transmitted along the trajectory, and
        a decelerator configured to reduce a speed of said source material in a section of said trajectory downstream of the plasma initiation site;
    a support constructed and arranged to support a patterning device, the patterning device being configured to impart radiation generated by the plasma radiation source to form a patterned radiation beam; and
    a projection system constructed and arranged to project the patterned radiation beam onto a substrate.

13. A method of catching a source material of a plasma radiation source, the method comprising:
    transmitting said in the form of droplets through a plasma initiation site along a trajectory;
    reducing a speed of said source material in a section of said trajectory downstream of said plasma initiation site; and
    catching said source material.

14. The method of claim 13, further comprising retaining said caught source material in a vessel in which said source material is caught.

15. The method of claim 14, wherein said retaining comprises electrically attracting said source material to the vessel.

16. The method of claim 14, wherein said retaining comprises supplying a gas flow in a direction substantially parallel to the trajectory of said source material and towards the vessel.

17. The method of claim 14, wherein said retaining comprises generating a magnetic field within the vessel.

18. The method of claim 14, wherein said reducing the speed comprises generating an electric field downstream of said plasma initiation site.

19. The method of claim 14, wherein said reducing the speed comprises supplying a gas flow in a direction substantially parallel to the trajectory of said source material and away from the vessel.

20. The method of claim 14, wherein said reducing the speed comprises generating a magnetic field downstream of said plasma initiation site.

* * * * *